United States Patent
Hashimoto

(10) Patent No.: US 8,164,351 B2
(45) Date of Patent: *Apr. 24, 2012

(54) TEST APPARATUS

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 12/603,350

(22) Filed: Oct. 21, 2009

(65) Prior Publication Data

US 2011/0018559 A1 Jan. 27, 2011

Related U.S. Application Data

(63) Continuation of application No. PCT/JP2009/003482, filed on Jul. 23, 2009.

(51) Int. Cl.
*G01R 27/26* (2006.01)
*G01R 27/08* (2006.01)
*G01R 31/26* (2006.01)

(52) U.S. Cl. .... 324/678; 324/705; 324/713; 324/762.01

(58) Field of Classification Search ................ 324/678, 324/713, 763, 765

See application file for complete search history.

(56) References Cited

U.S. PATENT DOCUMENTS

| | | | |
|---|---|---|---|
| 5,789,934 A * | 8/1998 | Kolkowski et al. | 324/537 |
| 6,087,843 A | 7/2000 | Pun et al. | |
| 6,323,668 B1 * | 11/2001 | Hashimoto | 324/763 |
| 6,556,034 B1 * | 4/2003 | Johnson et al. | 324/765 |
| 7,005,867 B2 * | 2/2006 | Hashimoto | 324/713 |
| 7,132,844 B2 * | 11/2006 | Hashimoto | 324/765 |
| 2001/0017769 A1 | 8/2001 | Ito | |
| 2002/0135340 A1 | 9/2002 | Hashimoto | |
| 2008/0174318 A1 | 7/2008 | Seki | |

(Continued)

FOREIGN PATENT DOCUMENTS

JP 7-209372 A 8/1995

(Continued)

OTHER PUBLICATIONS

International Search Report (ISR) for PCT/JP2009/003482 (parent application) for Examiner consideration. Concise Explanation of Relevance: This ISR cites U.S. Patent Application Publication Nos. 2-4 and Foreign Patent Document Nos. 2-9 listed above as category A: document defining the general state of the art which is not considered to be of particular relevance.

(Continued)

*Primary Examiner* — Timothy J Dole
(74) *Attorney, Agent, or Firm* — Chen Yoshimura LLP

(57) ABSTRACT

Provided is a test apparatus that tests a device under test, including a power supply that generates supply power supplied to the device under test, a transmission path that transmits the supply power generated by the power supply to the device under test, an intermediate capacitor that is provided between the transmission path and a ground potential, a power supply current measuring section that measures a current flowing through the transmission path at a position closer to the power supply than the intermediate capacitor, a charge and discharge current measuring section that measures a charge and discharge current of the intermediate capacitor, and a load current calculating section that calculates a load current flowing through the device under test based on a sum of the current measured by the power supply current measuring section and the current measured by the charge and discharge current measuring section.

4 Claims, 5 Drawing Sheets

U.S. PATENT DOCUMENTS

2009/0121725 A1* 5/2009 Hashimoto .................. 324/537

FOREIGN PATENT DOCUMENTS

| | | |
|---|---|---|
| JP | 7-248353 A | 9/1995 |
| JP | 11-23655 A | 1/1999 |
| JP | 2001-195139 A | 7/2001 |
| JP | 2001-251034 A | 9/2001 |
| JP | 2006-344740 A | 12/2006 |
| JP | 2009-74900 A | 4/2009 |
| JP | 2009-115794 A | 5/2009 |
| WO | 2006/054435 A1 | 5/2006 |

OTHER PUBLICATIONS

Applicant bring the attention of the Examiner to the following pending U.S. Appl. No. 12/876,052, filed Sep. 3, 2010, U.S. Appl. No. 12/876,057, filed Sep. 3, 2010, U.S. Appl. No. 12/877,097, filed Sep. 7, 2010, U.S. Appl. No. 12/502,946, filed Jul. 14, 2009.

* cited by examiner

US 8,164,351 B2

TEST APPARATUS

CROSS REFERENCE TO RELATED APPLICATION

This is a continuation application of PCT/JP2009/003482 filed on Jul. 23, 2009, the contents of which are incorporated herein by reference.

BACKGROUND

1. Technical Field

The present invention relates to a test apparatus.

2. Related Art

When testing a device under test such as a semiconductor circuit, the power supply apparatus that supplies a power supply current to the device under test sometimes cannot quickly follow fluctuation in the current consumed by the device under test. One known technique for solving this problem involves providing a bypass capacitor in a power supply line near the device under test, as shown in Patent Document 1.

Patent Document 1: Japanese Patent Application Publication No. 2001-195139
Patent Document 2: U.S. Pat. No. 6,087,843

When there is a large fluctuation in the power supply current, a bypass capacitor with a high capacitance, such as tens of μF, is provided to track the fluctuation. A small output current of the power supply apparatus can be measured to measure a small current such as a standby current. In such a case, the load capacitance connected to the power supply apparatus is limited, and so a reed relay is provided to disconnect the high-capacitance bypass capacitor from the power supply line.

However, the reed relay cannot be provided because there are structural restrictions near the device under test. Therefore, the high-capacitance bypass capacitor must be provided at a distance from the device under test.

As a result, the power supply line from the bypass capacitor to the device under test is lengthened, and so the inductance component between the bypass capacitor and the device under test increases. This makes it difficult to supply high-frequency current from the bypass capacitor to the device under test.

One type of test for the device under test involves measuring the power consumed during operation of the device under test. With this test, the power consumed by the device under test is measured by measuring the current flowing through the power supply line. More specifically, the power consumed by the device under test is measured by measuring the current flowing through the power supply line closer to the device under test than the bypass capacitor.

As described above, however, it is difficult to supply a high-frequency current from the high-capacitance bypass capacitor to the device under test. Therefore, even if the current flowing through the power supply line is measured between the high-capacitance bypass capacitor and the device under test, it is difficult to accurately measure the consumed current of the device under test which fluctuates at a high frequency.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a power supply that generates supply power supplied to the device under test; a transmission path that transmits the supply power generated by the power supply to the device under test; an intermediate capacitor that is provided between the transmission path and a ground potential; a power supply current measuring section that measures a current flowing through the transmission path at a position closer to the power supply than the intermediate capacitor; a charge and discharge current measuring section that measures a charge and discharge current of the intermediate capacitor; and a load current calculating section that calculates a load current flowing through the device under test based on a sum of the current measured by the power supply current measuring section and the current measured by the charge and discharge current measuring section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
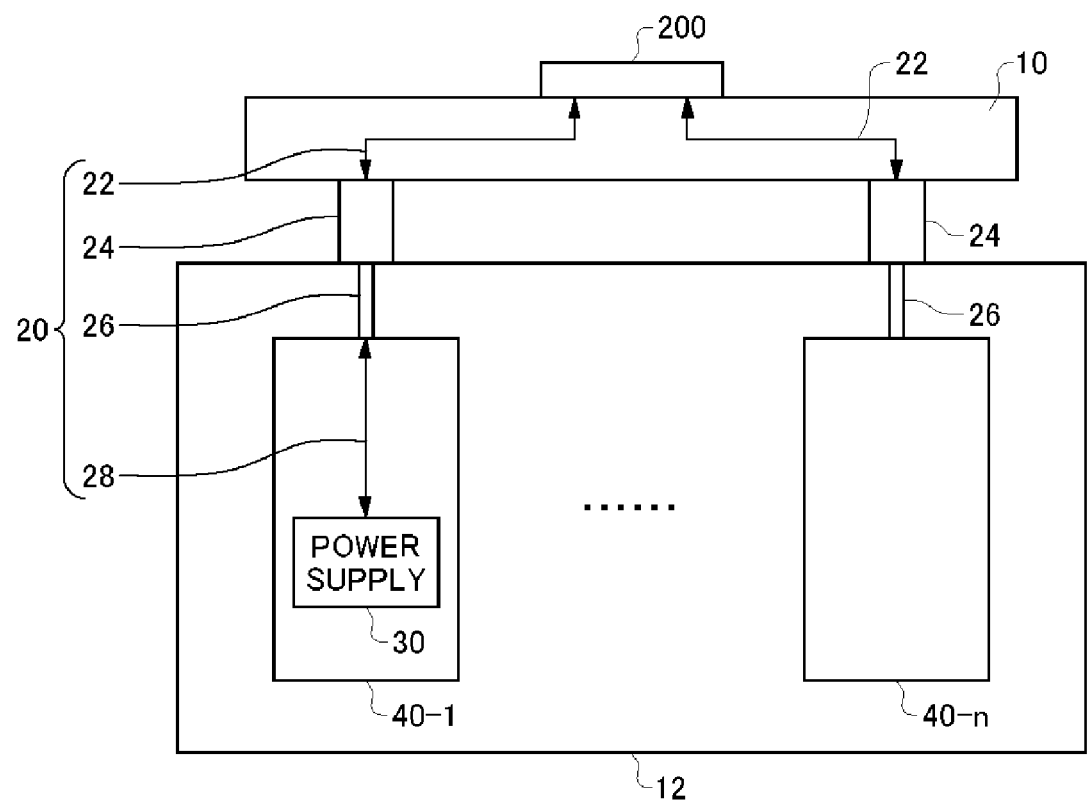
FIG. 1 shows a configuration of a test apparatus 100 according to an embodiment of the present invention, along with a device under test 200.

FIG. 1 shows a configuration of a test apparatus 100 according to an embodiment of the present invention, along with a device under test 200. The test apparatus 100 tests the device under test 200, which is a semiconductor circuit or the like, and is provided with a test board 10 and a test head 12.

The test board 10 electrically connects the test head 12 to the device under test 200. For example, the device under test 200 is loaded on the test board 10, and the test board 10 may include a socket that electrically connects to the device under test 200 and wiring that electrically connects the socket and the test head 12. The test board 10 may instead include a probe pin that contacts a terminal of the device under test 200 and wiring that connects the probe pin and the test head 12.

The test head 12 generates a test signal and supply power, or the like, and supplies the generated signal and power to the device under test 200 via the test board 10. The test head 12 measures a prescribed characteristic of the device under test 200 when a test signal or the like is supplied thereto, and judges acceptability of the device under test 200. For example, the test head 12 may measure a data pattern of a signal output by the device under test 200, the power consumed by the device under test 200, or the like.

The test head 12 of the present embodiment includes a plurality of test modules 40. Each test module 40 is connected to the test board 10 via the connector 24. Each test module 40 may have a different function. For example, the test head 12 may include a test module 40 for the supply power, a test module 40 for an analog signal, a test module 40 for a digital signal, and the like.

The test module 40-1 of the present embodiment includes a power supply 30 that supplies the device under test 200 with supply power. The power supply 30 is electrically connected to the device under test 200 via the transmission path 20.

The transmission path 20 transmits the supply power generated by the power supply 30 to the device under test 200. The transmission path 20 may include a module wire 28, a cable 26, a connector 24, and a board wiring 22. The module wire 28 is formed within the test module 40. The cable 26 provides a connection between the test module 40 and the connector 24. The board wiring 22 is formed on the test board 10.

The test apparatus 100 of the present embodiment measures the power consumed by the device under test 200 by measuring the current flowing through the transmission path 20. The test module 40-1 may judge the acceptability of the device under test 200 based on the measurement result of the current flowing through the transmission path 20.

Figure 2:
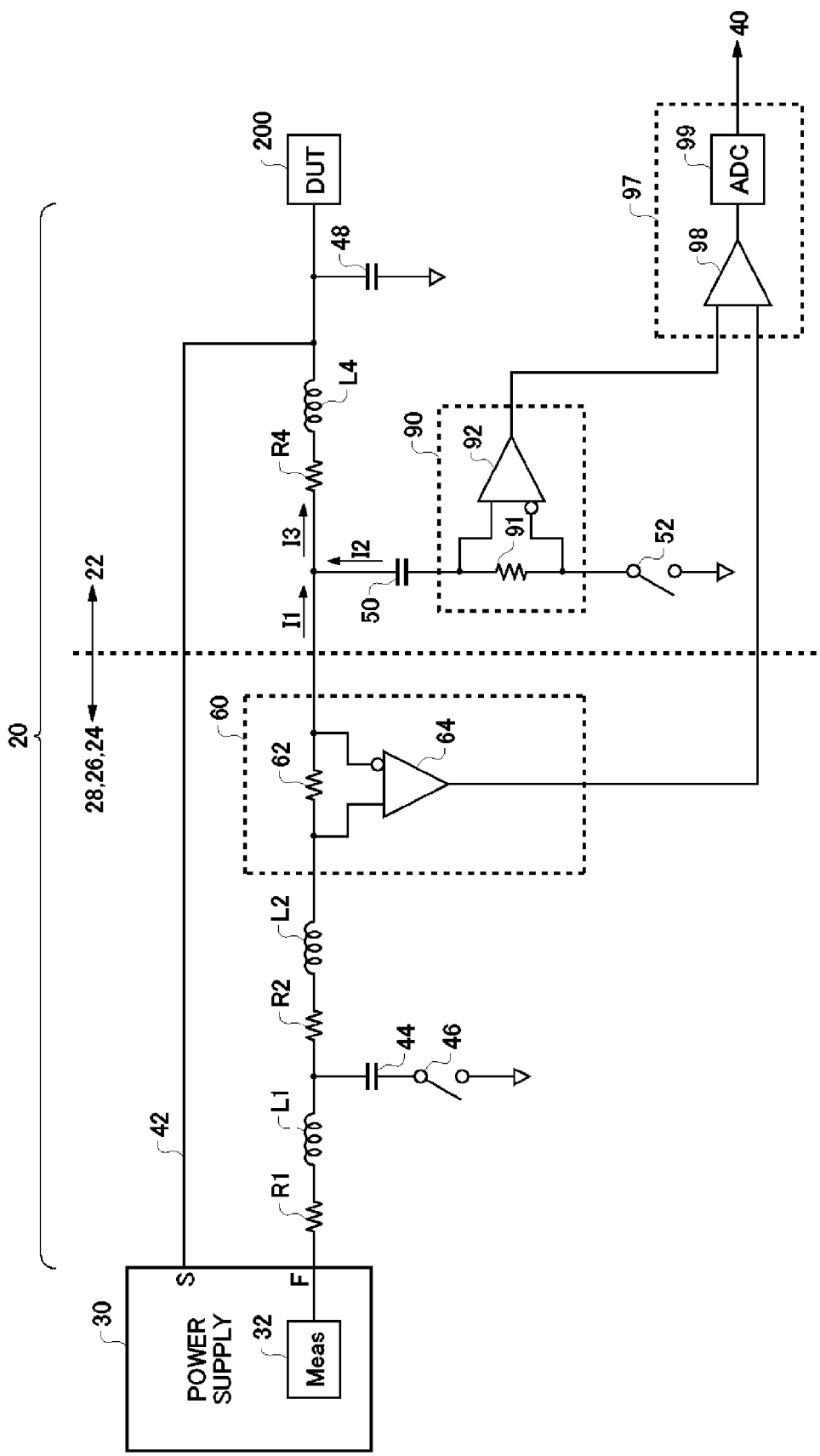
FIG. 2 shows an exemplary configuration of a circuit for measuring the current flowing through the transmission path 20.

FIG. 2 shows an exemplary configuration of a circuit for measuring the current flowing through the transmission path 20. As described above, the power supply 30 is connected to the device under test 200 via the transmission path 20. The power supply 30 may include a small current measuring section 32 that measures a small current, such as a standby current, of the device under test 200. The small current measuring section 32 may measure the current output by the power supply 30.

The test apparatus 100 includes a high-capacitance capacitor 44, a switch 46, an intermediate capacitor 50, a charge and discharge current measuring section 90, a switch 52, a low-capacitance capacitor 48, a power supply current measuring section 60, and a load current calculating section 97. In FIG. 2, R1, R2, R4, L1, L2, and L4 represent resistance components and inductance components of the transmission path 20.

The high-capacitance capacitor 44 is provided between the transmission path 20 and a ground potential at a position closer to the power supply 30 than the intermediate capacitor 50. The high-capacitance capacitor 44 of the present embodiment is provided between the ground potential and the transmission path 20 on the power supply 30 side of the connector 24, i.e. on the module wire 28. The capacitance of the high-capacitance capacitor 44 may be greater than the maximum load capacitance allowed by the small current measuring section 32. The maximum load capacitance may be a value according to specifications of the small current measuring section 32.

The switch 46 switches whether the high-capacitance capacitor 44 is connected between the module wire 28 and the ground potential. The switch 46 may be a reed relay.

The low-capacitance capacitor 48 is provided between the transmission path 20 and the ground potential at a position closer to the device under test 200 than the intermediate capacitor 50. The low-capacitance capacitor 48 of the present embodiment is provided on the test board 10 between the board wiring 22 and the ground potential. The capacitance of the low-capacitance capacitor 48 is less than the capacitance of the high-capacitance capacitor 44. The capacitance of the low-capacitance capacitor 48 may be less than the maximum load capacitance allowed by the small current measuring section 32.

The intermediate capacitor 50 is positioned between the ground potential and a position on the transmission path 20 that is between the high-capacitance capacitor 44 and the low-capacitance capacitor 48. The intermediate capacitor 50 is desirably connected to the transmission path 20 such that the distance between the intermediate capacitor 50 and the low-capacitance capacitor 48 is less than the distance between the intermediate capacitor 50 and the high-capacitance capacitor 44.

More specifically, the intermediate capacitor 50 is desirably positioned such that the inductance component L4 of the transmission path 20 between the intermediate capacitor 50 and the low-capacitance capacitor 48 is sufficiently less than the inductance component L2 of the transmission path 20 between the intermediate capacitor 50 and the high-capacitance capacitor 44. The intermediate capacitor 50 of the present embodiment is connected to the board wiring 22 of the test board 10 between the low-capacitance capacitor 48 and the connector 24. By providing the intermediate capacitor 50 closer to the device under test 200 than the cable 26 and the connector 24, the inductance component L4 can be kept sufficiently smaller than the inductance component L2. As a result, the charge and discharge current intermediate capacitor 50 can follow the fluctuation in the power consumed by the device under test 200 relatively quickly.

The capacitance of the intermediate capacitor 50 may be greater than the capacitance of the low-capacitance capacitor 48 and less than the capacitance of the high-capacitance capacitor 44. For example, the capacitance of the low-capacitance capacitor 48 may be 1 μF and the capacitance of the intermediate capacitor 50 may be approximately 10 μF. The capacitance of the intermediate capacitor 50 may be greater than the maximum load capacitance of allowed by the small current measuring section 32.

The switch 52 switches whether the intermediate capacitor 50 is connected between the module wire 28 and the ground potential. The switch 52 may be smaller than the switch 46. For example, the switch 52 may be a semiconductor switch. When the small current measuring section 32 measures the small current such as the standby current of the device under test, the switches 46 and 52 remove the high-capacitance capacitor 44 and the intermediate capacitor 50 from between the transmission path 20 and the ground potential.

The power supply current measuring section 60 measures a current I1 flowing through the transmission path 20 closer to the power supply 30 than the intermediate capacitor 50. For example, the power supply current measuring section 60 measures the current I1 flowing through the transmission path 20 between the high-capacitance capacitor 44 and the connector 24. The power supply current measuring section 60 may be provided on the test module 40.

The power supply current measuring section 60 of the present embodiment includes a first detection resistor 62 and a differential circuit 64. The first detection resistor 62 of the present embodiment is provided on the transmission path 20 on the power supply 30 side of the connector 24, and causes a voltage drop according to the value of the current flowing through the transmission path 20. For example, the first detection resistor 62 may be provided on the module wire 28.

The differential circuit 64 functions as a first potential difference detecting section that detects a potential difference between the ends of the first detection resistor 62. By dividing this potential difference by the resistance value of the first detection resistor 62, the current I1 flowing through the first detection resistor 62 can be measured.

The configuration of the power supply current measuring section 60 is not limited to the configuration shown in FIG. 2. For example, the power supply current measuring section 60 may have a current probe instead of the first detection resistor 62 and the differential circuit 64. The current probe may detect the current flowing through the transmission path 20 by converting, into a voltage, the magnetic field caused by the current flowing through the transmission path 20.

The charge and discharge current measuring section 90 measures a charge and discharge current I2 of the intermediate capacitor 50. The charge and discharge current measuring section 90 of the present embodiment includes a second detection resistor 91 and a differential circuit 92. The second detection resistor 91 is provided between the intermediate capacitor 50 and the switch 52, and causes a voltage drop according to the charge and discharge current I2 of the intermediate capacitor 50.

The differential circuit 92 functions as a second potential difference detecting section that detects a potential difference between the ends of the second detection resistor 91. By dividing this potential difference by the resistance value of the second detection resistor 91, the current I2 flowing through the second detection resistor 91 can be measured.

The load current calculating section 97 calculates the load current I3 flowing through the device under test 200 based on the sum of the current I1 measured by the power supply current measuring section 60 and the current I2 measured by the charge and discharge current measuring section 90. The load current calculating section 97 includes an operational amplifier 98 and an AD converter 99. The operational amplifier 98 outputs a voltage corresponding to the sum of the current I1 and the current I2. The AD converter 99 converts the output voltage value of the operational amplifier 98 into a digital value.

As described above, by providing the intermediate capacitor 50 near the device under test 200 and obtaining the sum of the charge and discharge current I2 of the intermediate capacitor 50 and the power supply current I1, the power consumed by the device under test 200 can be measured accurately. In other words, even when the power supply current I1 cannot quickly follow the fluctuation of the power consumed by the device under test 200, the power consumed by the device under test 200 can be accurately measured since the charge and discharge current I2, which fluctuates quickly, is also measured.

Furthermore, the power supply current measuring section 60 is provided closer to the power supply 30 side than the intermediate capacitor 50, and this positioning allows for easier circuit design compared to providing the power supply current measuring section 60 on the test board 10. Instead of the power supply current measuring section 60, a measurement circuit housed in the power supply 30, such as the small current measuring section 32, may be used to measure the power supply current I1.

Using a semiconductor switch as the switch 52 allows the switch 52 to be easily provided to the test board 10, which has structural limitations regarding the height of elements therein and the like. Therefore, even if the test board 10 is provided with a relatively high capacitance intermediate capacitor 50, the switch 52 can be provided to control whether the intermediate capacitor 50 is connected to the transmission path 20.

The power supply 30 may detect the load voltage applied to the device under test 200 via a detection line 42. The power supply 30 may control the output voltage such that the detected load voltage remains constant. The detection line 42 may detect the voltage of the transmission path 20 at a position closer to the device under test 200 than the power supply current measuring section 60.

Figure 3:
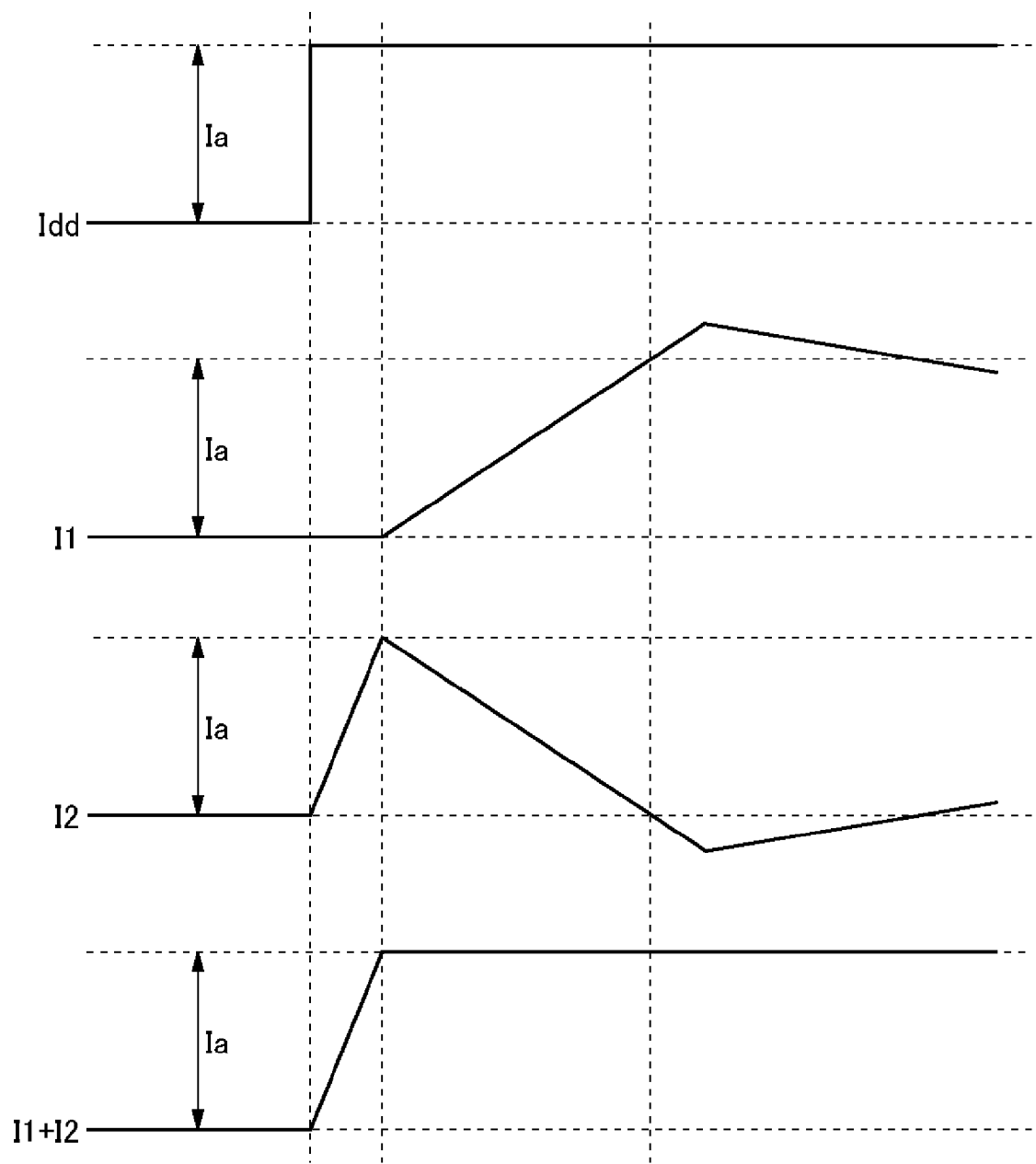
FIG. 3 shows examples of the current I1 measured by the power supply current measuring section 60 and the current I2 measured by the charge and discharge current measuring section 90.

FIG. 3 shows examples of the current I1 measured by the power supply current measuring section 60 and the current I2 measured by the charge and discharge current measuring section 90. In FIG. 3, the horizontal axes represent time and the vertical axes represent current level. Furthermore, Idd represents the current consumed by the device under test 200.

As shown in FIG. 3, when the consumed current Idd of the device under test 200 changes suddenly, the power supply current I1 from the power supply 30 and the high-capacitance capacitor 44 cannot follow quickly. On the other hand, the charge and discharge current I2 from the intermediate capacitor 50 can follow the consumed current Idd relatively quickly. Therefore, as shown in FIG. 3, the consumed current Idd of the device under test 200 can be measured accurately by calculating the sum of the power supply current I1 and the charge and discharge current I2.

In the circuit described in relation to FIG. 2, the first detection resistor 62 and the second detection resistor 91 are provided as additional elements to detect the current. Therefore, the fluctuation in the power supply voltage applied to the device under test 200 when the current consumed by the device under test 200 fluctuates increases according to the resistance values of the first detection resistor 62 and the second detection resistor 91.

The resistance value of the first detection resistor 62 is represented as R1, the resistance value of the second detection resistor 91 is represented as R2, and the maximum fluctuation amount of the consumed current Idd is represented as Ia. The maximum fluctuation $\Delta V max$ in the power supply voltage applied to the device under test 200 due to the addition of the first detection resistor 62 and the second detection resistor 91 can be calculated as $\Delta V max = a \times (R1 + R2)$.

The first detection resistor 62 and the second detection resistor 91 desirably have resistance values that corresponds to the amount of fluctuation allowed in the power supply voltage applied to the device under test 200. For example, when the maximum fluctuation amount of the consumed current is 100 mA and the allowable value for power supply current fluctuation is 20 mV, the sum of the resistance values of the first detection resistor 62 and the second detection resistor 91 is set to be no greater than 200 mΩ (20 mV/100 mA), according to the above Expression.

The current path of the power supply current I1 is an LCR series resonant circuit. Therefore, if the damping resistance of the series resonant circuit is not sufficiently less than the resistance component in this current path, a charge and discharge current having a large fluctuation flows therethrough. In such a case, the measurement result of the power supply current I1 includes a charge and discharge current for the intermediate capacitor 50 due to the series resonance. To counter this, the circuit shown in FIG. 2 measures the sum of the power supply current I1 and the charge and discharge current I2. Each of the power supply current I1 and the charge and discharge current I2 includes an effect of a charge and discharge current caused by the series resonance, and so the effects of the charge and discharge currents caused by the series resonance cancel each other out.

Figure 4:
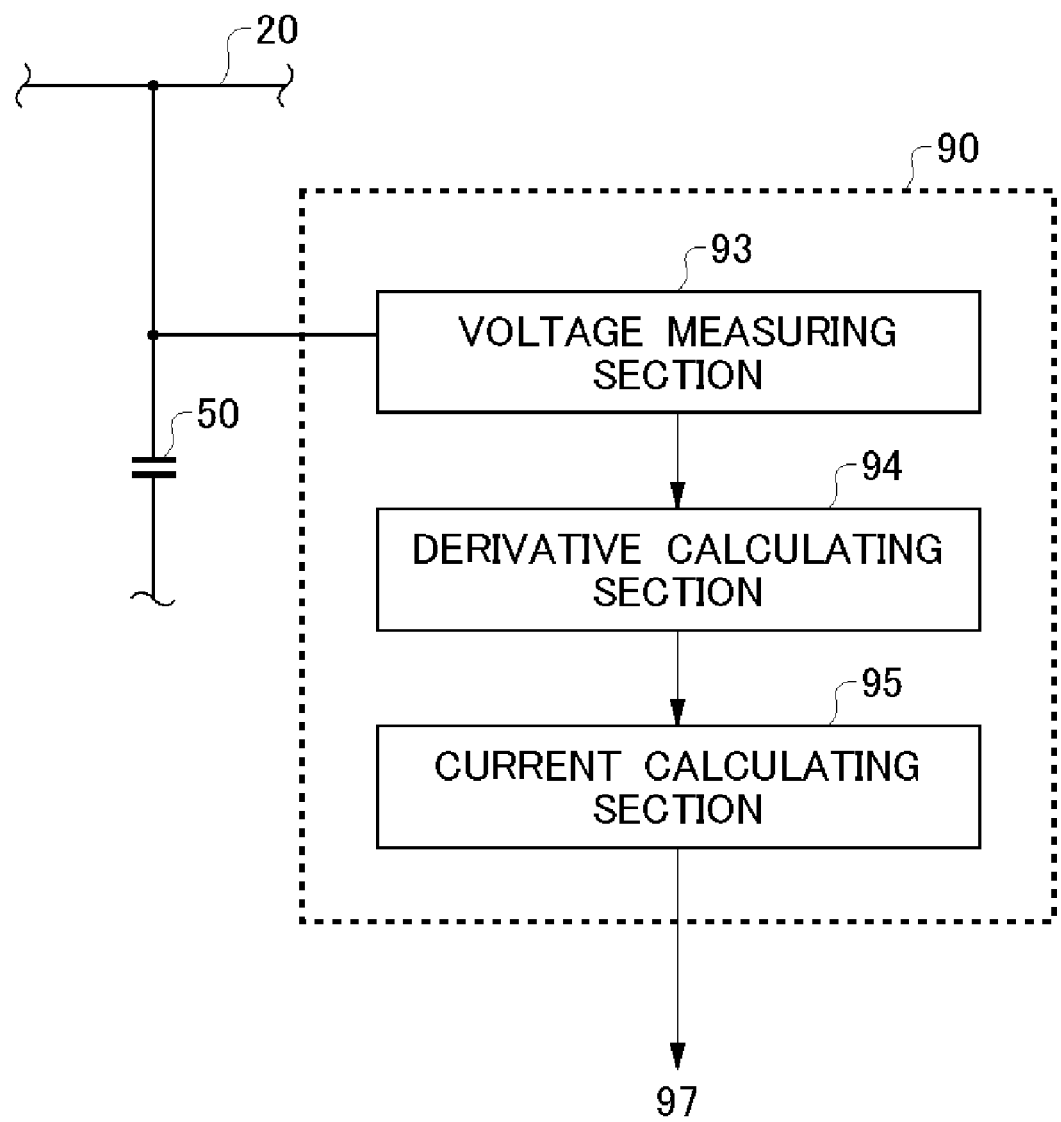
FIG. 4 shows another exemplary configuration of the charge and discharge current measuring section 90.

FIG. 4 shows another exemplary configuration of the charge and discharge current measuring section 90. The charge and discharge current measuring section 90 of the present embodiment includes a voltage measuring section 93, a derivative calculating section 94, and a current calculating section 95. The voltage measuring section 93 measures the voltage of the intermediate capacitor 50. For example, the voltage measuring section 93 may measure the change in voltage over time at a terminal on the transmission path 20 side of the intermediate capacitor 50.

The derivative calculating section 94 calculates the derivative value of the voltage measured by the voltage measuring section 93. The current calculating section 95 calculates the charge and discharge current of the intermediate capacitor 50 based on the derivative value calculated by the derivative calculating section 94. The current calculating section 95 may calculate the current value of the charge and discharge current of the intermediate capacitor 50 as being the derivative value of the voltage measured by the voltage measuring section 93. With this configuration, the charge and discharge current of the intermediate capacitor 50 can be measured without using the second detection resistor 91.

Figure 5:
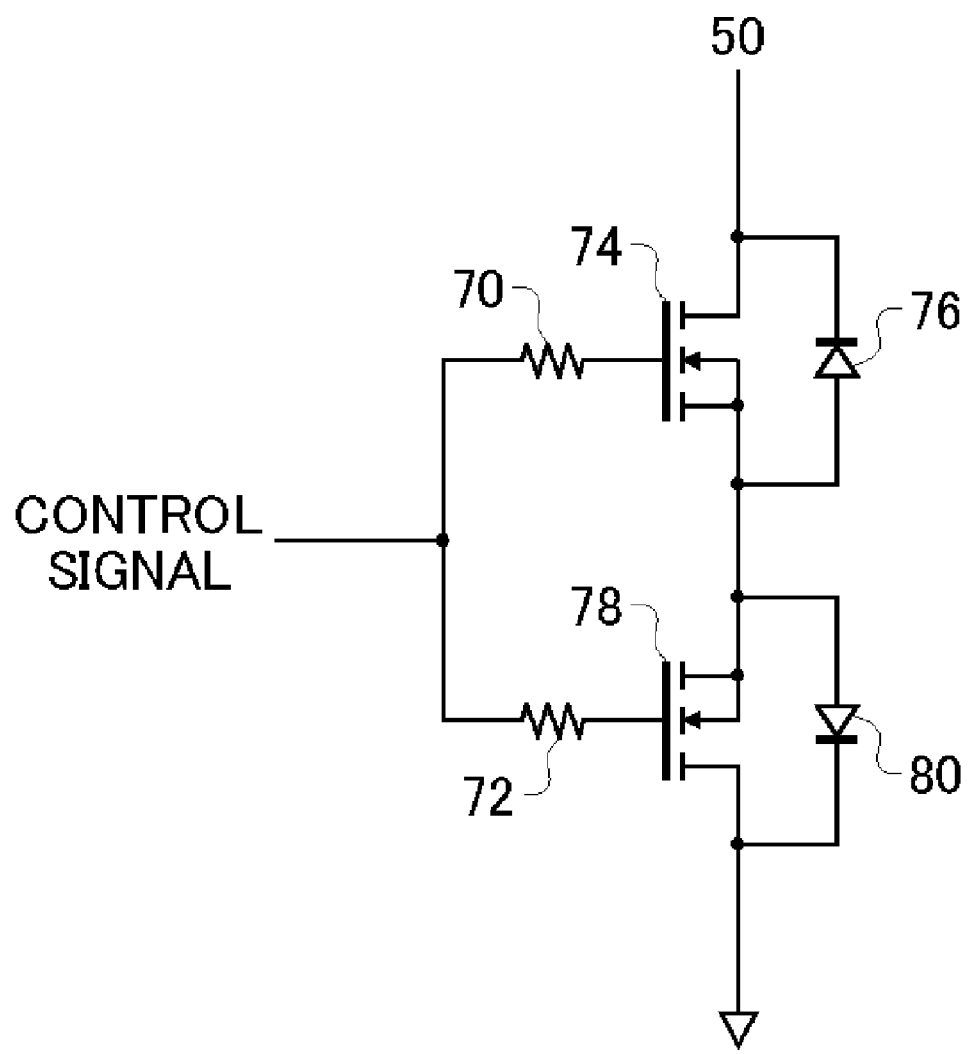
FIG. 5 shows an exemplary configuration of the switch 52.

FIG. 5 shows an exemplary configuration of the switch 52. The switch 52 includes a transistor 74, a transistor 78, a diode 76, a diode 80, a resistor 70 and a resistor 72. The transistor 74 and the transistor 78 are arranged serially between the intermediate capacitor 50 and the ground potential. The transistor 74 and the transistor 78 receive control signals in parallel via the resistor 70 and the resistor 72. The transistor 74 and the transistor 78 may have the same polarity.

The diode 76 is a parasitic diode formed between the source and drain of the transistor 74. The diode 80 is a parasitic diode formed between the source and drain of the transistor 78. In the present embodiment, the diode 76 is arranged to have its forward direction oriented from the ground potential to the intermediate capacitor 50, and the diode 80 is arranged to have its backward direction oriented from the intermediate capacitor 50 to the ground potential.

When the control voltage is H level, the intermediate capacitor 50 is connected to the ground potential via the transistors 74 and 78. When the control voltage is L level, each transistor is OFF and each diode is in a backward connection such that current does not flow, and so the intermediate capacitor 50 is not connected to the ground potential. This configuration allows the switch 52 to be small and consume little power.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a power supply that generates supply power supplied to the device under test;
    a transmission path that transmits the supply power generated by the power supply to the device under test;
    an intermediate capacitor that is provided between the transmission path and a ground potential;
    a power supply current measuring section that measures a current flowing through the transmission path at a position closer to the power supply than the intermediate capacitor;
    a charge and discharge current measuring section that measures a charge and discharge current of the intermediate capacitor;
    a load current calculating section that calculates a load current flowing through the device under test based on a sum of the current measured by the power supply current measuring section and the current measured by the charge and discharge current measuring section;
    a high-capacitance capacitor that is provided between the ground potential and the transmission path at a position closer to the power supply than the intermediate capacitor is, and that has a capacitance greater than the capacitance of the intermediate capacitor;
    a low-capacitance capacitor that is positioned between the ground potential and the transmission path at a position closer to the device under test than the intermediate capacitor is, and that has a capacitance smaller than the capacitance of the intermediate capacitor,
    wherein the intermediate capacitor is connected to the transmission path at a position at which a distance between the intermediate capacitor and the low-capacitance capacitor is less than a distance between the intermediate capacitor and the high-capacitance capacitor;
    a test board that contacts the device under test,
    wherein the low-capacitance capacitor and the intermediate capacitor are provided on the test board; and
    a connector that is provided on the transmission path and that electrically connects the test board to the power supply,
    wherein the high-capacitance capacitor is connected to the transmission path on the power supply side of the connector.

2. The test apparatus according to claim 1, wherein the power supply current measuring section measures the current flowing through the transmission path between the connector and the high-capacitance capacitor.

3. The test apparatus according to claim 2, wherein the power supply current measuring section includes:
    a first detection resistor that is provided on the transmission path on the power supply side of the connector; and
    a first potential difference detecting section that detects a potential difference between ends of the first detection resistor, and
    the charge and discharge current measuring section includes:
    a second detection resistor that is provided between the intermediate capacitor and the ground potential; and
    a second potential difference detecting section that detects a potential difference between ends of the second detection resistor.

4. The test apparatus according to claim 1, wherein the power supply current measuring section includes:
    a first detection resistor that is provided on the transmission path on the power supply side of the connector; and
    a first potential difference detecting section that detects a potential difference between ends of the first detection resistor, and the charge and discharge current measuring section includes:
  a voltage measuring section that measures voltage of the capacitor;
  a derivative calculating section that calculates a derivative value of the voltage measured by the voltage measuring section; and
  a current calculating section that calculates the charge and discharge current of the capacitor based on the derivative value calculated by the derivative calculating section.

* * * * *